(12) United States Patent
Matsumura et al.

(10) Patent No.: US 9,153,556 B2
(45) Date of Patent: Oct. 6, 2015

(54) ADHESIVE SHEET FOR MANUFACTURING SEMICONDUCTOR DEVICE, MANUFACTURING METHOD OF SEMICONDUCTOR DEVICE USING THE SHEET, AND SEMICONDUCTOR DEVICE OBTAINED BY THE METHOD (75) Inventors: Takeshi Matsumura, Ibaraki (JP);
Sadahito Misumi, Ibaraki (JP);
Kazuhito Hosokawa, Ibaraki (JP);
Hiroyuki Kondo, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 832 days.

(21) Appl. No.: 12/759,470

(22) Filed: Apr. 13, 2010

(65) Prior Publication Data
US 2010/0197080 A1 Aug. 5, 2010

Related U.S. Application Data

(62) Division of application No. 11/851,963, filed on Sep. 7, 2007, now abandoned.

(60) Provisional application No. 60/825,029, filed on Sep. 8, 2006.

(51) Int. Cl.
*H01L 21/44* (2006.01)
*H01L 21/48* (2006.01)
(Continued)

(52) U.S. Cl.
CPC ............ *H01L 24/83* (2013.01); *H01L 23/3121* (2013.01); *H01L 24/27* (2013.01); *H01L 24/29* (2013.01); *H01L 24/85* (2013.01); *H01L 24/98* (2013.01); *H01L 25/0657* (2013.01); *H01L 25/50* (2013.01); *H01L 24/45* (2013.01); *H01L 24/48* (2013.01); *H01L 2224/29* (2013.01); *H01L 2224/2919* (2013.01); *H01L 2224/2929* (2013.01); *H01L 2224/29101* (2013.01); *H01L 2224/29311* (2013.01); *H01L 2224/29316* (2013.01); *H01L 2224/29318* (2013.01); *H01L 2224/29324* (2013.01);
(Continued)

(58) Field of Classification Search
USPC ............................................. 438/51, 64, 127
See application file for complete search history.

(56) References Cited

U.S. PATENT DOCUMENTS

| 5,411,921 A | 5/1995 | Negoro |
| 5,894,983 A | 4/1999 | Beck et al. |

(Continued)

FOREIGN PATENT DOCUMENTS

| DE | 198 03 407 | 2/1999 |
| EP | 0 535 433 | 4/1993 |

(Continued)

OTHER PUBLICATIONS

Japanese Office Action issued on the corresponding Japanese Patent Application No. 2004-172064, dated May 26, 2009.

*Primary Examiner* — David S Blum
(74) *Attorney, Agent, or Firm* — Knobbe Martens Olson and Bear LLP

(57) ABSTRACT

The adhesive sheet for manufacturing a semiconductor device is an adhesive sheet for manufacturing a semiconductor device used when a semiconductor element is adhered to an adherend and the semiconductor element is wire-bonded, and is a peelable adhesive sheet in which the 180 degree peeling adhesive strength against a silicon wafer is 5 (N/25 mm width) or less.

2 Claims, 3 Drawing Sheets

(51) Int. Cl.
*H01L 21/50* (2006.01)
*H01L 21/00* (2006.01)
*H01L 23/00* (2006.01)
*H01L 23/31* (2006.01)
*H01L 25/065* (2006.01)
*H01L 25/00* (2006.01)

(52) U.S. Cl.
CPC ......... *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29371* (2013.01); *H01L 2224/29386* (2013.01); *H01L 2224/29393* (2013.01); *H01L 2224/32145* (2013.01); *H01L 2224/32225* (2013.01); *H01L 2224/32245* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/48247* (2013.01); *H01L 2224/73265* (2013.01); *H01L 2224/8388* (2013.01); *H01L 2224/83191* (2013.01); *H01L 2224/83192* (2013.01); *H01L 2224/83855* (2013.01); *H01L 2224/83885* (2013.01); *H01L 2224/85205* (2013.01); *H01L 2224/92* (2013.01); *H01L 2224/92247* (2013.01); *H01L 2225/0651* (2013.01); *H01L 2924/00013* (2013.01); *H01L 2924/00014* (2013.01); *H01L 2924/0102* (2013.01); *H01L 2924/0103* (2013.01); *H01L 2924/014* (2013.01); *H01L 2924/01004* (2013.01); *H01L 2924/0105* (2013.01); *H01L 2924/01005* (2013.01); *H01L 2924/01006* (2013.01); *H01L 2924/01013* (2013.01); *H01L 2924/01014* (2013.01); *H01L 2924/01015* (2013.01); *H01L 2924/01024* (2013.01); *H01L 2924/01027* (2013.01); *H01L 2924/01028* (2013.01); *H01L 2924/01029* (2013.01); *H01L 2924/01033* (2013.01); *H01L 2924/01046* (2013.01); *H01L 2924/01047* (2013.01); *H01L 2924/01051* (2013.01); *H01L 2924/01056* (2013.01); *H01L 2924/01074* (2013.01); *H01L 2924/01079* (2013.01); *H01L 2924/01082* (2013.01); *H01L 2924/0665* (2013.01); *H01L 2924/07802* (2013.01); *H01L 2924/10253* (2013.01); *H01L 2924/15747* (2013.01); *H01L 2924/20103* (2013.01); *H01L 2924/20104* (2013.01); *H01L 2924/20105* (2013.01); *H01L 2924/20106* (2013.01); *H01L 2924/20107* (2013.01); *H01L 2924/3011* (2013.01)

(56) References Cited

U.S. PATENT DOCUMENTS

| 6,558,975 | B2 | 5/2003 | Sugino et al. |
| 7,060,593 | B2 * | 6/2006 | Kurosawa et al. ............ 438/464 |
| 2002/0079567 | A1 | 6/2002 | Lo et al. |
| 2002/0121680 | A1 | 9/2002 | Ahn et al. |
| 2005/0156321 | A1 | 7/2005 | Misumi et al. |
| 2005/0224821 | A1 | 10/2005 | Sakano et al. |
| 2005/0224978 | A1 | 10/2005 | Kawate et al. |
| 2005/0253286 | A1 | 11/2005 | Yoshikawa et al. |
| 2008/0185700 | A1 | 8/2008 | Takamatsu et al. |
| 2009/0001611 | A1 | 1/2009 | Matsumura et al. |

FOREIGN PATENT DOCUMENTS

| EP | 0 571 649 | | 12/1993 |
| JP | 55-111151 | | 8/1980 |
| JP | 59-003779 | | 1/1984 |
| JP | 2-044751 | | 2/1990 |
| JP | 3-222441 | | 10/1991 |
| JP | 7-102225 | | 4/1995 |
| JP | 8-255803 | | 10/1996 |
| JP | 11-067699 | | 3/1999 |
| JP | 2000-104040 | | 4/2000 |
| JP | 2001-081439 | | 3/2001 |
| JP | 2001-313301 | | 11/2001 |
| JP | 2002-105428 | | 4/2002 |
| JP | 2002-158276 | | 5/2002 |
| JP | 2002-179769 | | 6/2002 |
| JP | 2002-261233 | | 9/2002 |
| JP | 2003-264205 | | 9/2003 |
| JP | 2004-026953 | | 1/2004 |
| JP | 2004-059859 | | 2/2004 |
| JP | 2005-120206 | | 5/2005 |
| WO | WO 2004/000966 | A1 | 12/2003 |
| WO | WO 2005/113696 | A1 | 12/2005 |

* cited by examiner

ADHESIVE SHEET FOR MANUFACTURING SEMICONDUCTOR DEVICE, MANUFACTURING METHOD OF SEMICONDUCTOR DEVICE USING THE SHEET, AND SEMICONDUCTOR DEVICE OBTAINED BY THE METHOD

CROSS-REFERENCE TO PRIORITY AND RELATED APPLICATIONS

This application is a divisional application of U.S. patent application Ser. No. 11/851,963, filed Sep. 7, 2007, which claims priority to the U.S. Provisional Patent Application No. 60/825,029, filed Sep. 8, 2006. The disclosure of the above-referenced applications are incorporated by reference herein. This application also is related to U.S. patent application Ser. No. 11/012,377, filed on Dec. 14, 2004, now issued as U.S. Pat. No. 7,232,709, issued on Jun. 19, 2007.

BACKGROUND OF THE INVENTION

1. Field of the Invention

The present invention relates to an adhesive sheet for manufacturing a semiconductor device, a manufacturing method of a semiconductor device using the sheet, and a semiconductor device obtained by the method.

2. Description of the Related Art

In order to correspond to the demand of microminiaturization and realization of high functionality of a semiconductor device, the wiring width of a power line and the interval between signal lines arranged on the entire area of the major surface of a semiconductor chip (a semiconductor element) have been becoming narrow. Thereby, an increase of impedance and interference of signals between signal lines of different nodes occur, which become the cause of impeding the demonstration of sufficient performance in operation speed, degree of allowance in operation voltage, anti-electrostatic breakdown strength, and the like in the semiconductor chip. In order to solve these problems, a package structure is proposed in which the semiconductor element is layered (for example, refer to Japanese Patent Application Laid-Open (JP-A) Nos. 55-111151 and 2002-261233).

On the other hand, as a substance used when a semiconductor element is fixed onto a substrate or the like, an example using a thermosetting paste resin (for example, refer to JP-A No. 2002-179769) and an example using an adhesive sheet in which a thermoplastic resin and a thermosetting resin are combined (for example, refer to JP-A Nos. 2002-261233 and 2000-104040) are proposed.

In the conventional manufacturing method of a semiconductor device, an adhesive sheet or an adhesive is used at the time of adhesion of a semiconductor element and a substrate, a lead frame, or a semiconductor element. The adhesion is performed by compression bonding (die attaching) a semiconductor element and a substrate or the like, and then by curing an adhesive sheet or the like in a heating step. Further, wires are bonded to connect the semiconductor element and the substrate electrically, and then sealing with a sealing resin is performed by molding with the sealing resin and curing (for example, refer to JP-A Nos. 2002-261233 and 2000-104040).

When the above-described wire-bonding is performed, the semiconductor element on the substrate or the like moves due to ultrasonic vibration and heating. Because of this, conventionally, there has been a necessity to fix the semiconductor element so as not to move by heating and curing the thermosetting paste resin and the thermosetting adhesive sheet through a heating step before the wire bonding.

Furthermore, for the adhesive sheet consisted of a thermoplastic resin and the adhesive sheet in which a thermosetting resin and a thermoplastic resin are combined, a heating step is necessary after the die attaching and before the wire-bonding for the purpose of ensuring adhesive strength with an adhesion target and improving wettability.

However, in the case that air bubbles, foreign objects, or the like are mixed in when this adhesive sheet is adhered to a semiconductor element (a wafer) or a semiconductor chip made into an individual piece with a method such as a roller method or vacuum pasting, this adhesive sheet cannot be peeled off nor removed from the semiconductor element or the semiconductor chip made into an individual piece, and the semiconductor element and the like have been wasted. Because of this, production cost has been high and a decrease of the yield has been brought about.

SUMMARY OF THE INVENTION

The present invention has been made in view of the above-described problems, and an objective thereof is also to provide an adhesive sheet for manufacturing a semiconductor device peelable in the case that there is trouble in pasting when a semiconductor element is pasted to an adherend using an adhesive sheet. Further, another objective is to provide a manufacturing method of a semiconductor device using the adhesive sheet and a semiconductor device obtained by the method.

The present inventors earnestly examined an adhesive sheet for manufacturing a semiconductor device, a semiconductor device obtained by using the sheet, and a manufacturing method thereof in order to solve the above-described conventional problems. As a result, it was found that the above objectives can be achieved by making the invention be configured as follows, and the present invention has been completed.

In order to solve the above-mentioned problems, the adhesive sheet for manufacturing a semiconductor device used when a semiconductor element is adhered to an adherend and the semiconductor element is wire-bonded, wherein a 180 degree peeling adhesive strength against a silicon wafer is 5 (N/25 mm width) or less.

According to the above-described configuration, because the 180 degree peeling adhesive strength against a silicon wafer of an adhesive sheet is 5 (N/25 mm width) or less, peeling-off is possible after the semiconductor element is adhered to an adherend. Further, peeling-off can be performed without damaging the semiconductor element and the like. Therefore, in the case that wrinkles, mixing of foreign objects, air bubbles, or the like occur when the semiconductor element is pasted onto the adherend using an adhesive sheet, wasting of the semiconductor element and the adherend becomes unnecessary by peeling off the adhesive sheet from the semiconductor element and the adherend. Because the conventional adhesive sheet is difficult to be peeled off from the semiconductor element, the semiconductor element and the like have been disposed of with the adhesive sheet in the case that trouble as described above occurs. However, because the semiconductor element is generally expensive as compared with the adhesive sheet, production cost increases if the semiconductor element is disposed of every time the above-described case occurs. However, in the configuration of the present invention, suppression of the production cost can be attempted because it should be sufficient to dispose only of the adhesive sheet. Here, the adherend includes a substrate, a lead frame, or a semiconductor element.

As the adhesive sheet, a sheet comprising a thermosetting resin can be used. As the adhesive sheet, a sheet comprising both of a thermosetting resin and a thermoplastic resin can be used.

As the thermosetting resin, an epoxy resin and/or a phenol resin preferably is/are used. As the thermoplastic resin, an acrylic resin is preferably used.

As the thermosetting resin, a sheet comprising an epoxy resin, a phenol resin, and an acrylic resin can be used, and the weight ratio of the acrylic resin to the epoxy resin and the phenol resin is preferably larger than 50%.

In order to solve the above-mentioned problems, the manufacturing method of a semiconductor device according to the present invention comprises a step of fixing a semiconductor element onto an adherend interposing the adhesive sheet for manufacturing a semiconductor device, a step of bonding wires to the semiconductor device, and a step of resin-sealing the semiconductor element with a sealing resin, wherein in the case of trouble occurring in the step of fixing, the semiconductor element is peeled off from the adhesive sheet and the step of fixing is repeated using another adhesive sheet.

According to the above-described method, in the case that the 180 degree peeling adhesive strength against a silicon wafer of the adhesive sheet is 5 (N/25 mm width) or less and trouble occurs in a fixing step (occurrence of wrinkles, foreign objects, air bubbles, or the like), the semiconductor element is peeled off from the adhesive sheet, and there is no necessity to waste semiconductor elements and the like that are more expensive than the adhesive sheet. Further, the semiconductor elements and the like can also be prevented from being damaged at the time of peeling. Thereby, the manufacturing of a semiconductor device becomes possible while suppressing the production cost.

The step of fixing is preferably performed at 70° C. or less. Thereby, pasting of the semiconductor element and the adherend becomes possible while suppressing the adhesive sheet from excessively adhering to the semiconductor element and the adherend. As a result, when the adhesive sheet is peeled off from the semiconductor element and the adherend, the semiconductor element can be prevented from being damaged.

In order to solve the above-mentioned problems, a semiconductor device according to the present invention is obtained by the manufacturing method of a semiconductor device.

The present invention has effects described below with the means explained above.

That is, according to the present invention, even in the case when there is an occurrence of wrinkles, mixing of foreign objects, air bubbles, or the like in the case of pasting a semiconductor element and an adherend using an adhesive sheet, the semiconductor element and the like can be prevented from being wasted by peeling the adhesive sheet off from the semiconductor element and the adherend. Thereby, the present invention has effects that suppression of the production cost become possible, and improvement of the yield becomes possible.

BRIEF DESCRIPTION OF THE DRAWINGS

FIGS. 1A and 1B are cross-sectional views roughly showing an adhesive sheet in an embodiment of the present invention, and FIG. 1A shows the case that the adhesive sheet consists of only an adhesive layer, and FIG. 1B shows the case that the adhesive layer is provided on a core material;

DETAILED DESCRIPTION OF THE PREFERRED EMBODIMENTS

The embodiments of the present invention are explained below referring to the drawings. However, portions unnecessary for the explanation are omitted, and there are portions shown in the drawings by magnifying, reducing, or the like to make the explanation easy.

(Adhesive Sheet for Manufacturing Semiconductor Device)

Figure 1:
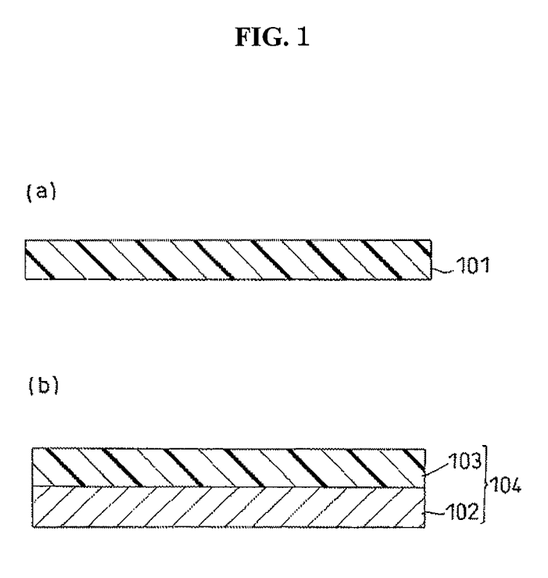

The adhesive sheet for manufacturing a semiconductor device according to the present invention is explained referring to FIGS. 1A and 1B. FIGS. 1A and 1B are cross-sectional views roughly showing the adhesive sheet in an embodiment of the present invention, and FIG. 1A shows the case that the adhesive sheet consists of only an adhesive layer, and FIG. 1B shows the case that the adhesive layer is provided on a core material.

The adhesive sheet according to the present invention has a technical characteristic that a 180 degree peeling adhesive strength against a silicon wafer is 5 (N/25 mm width) or less. Furthermore, the adhesive strength of the adhesive sheet is preferably in the range of 3.0 to 0.5 (N/25 mm width). When the adhesive strength is in this range, a semiconductor element can be adhered and fixed sufficiently to an adherend, and in the case that trouble occurs at the time of adhesion, the semiconductor element can be peeled off without being damaged.

A layered structure of the adhesive sheet is not especially limited. For example, an adhesive sheet 101 consisting of only a single adhesive layer as shown in FIG. 1A and an adhesive sheet 104 having a multi-layered structure in which an adhesive layer 103 is laminated on one face of a core material 102 as shown in FIG. 1B can be mentioned. Further, the adhesive layer 103 may be provided on both faces of the core material 102.

The core material 102 includes films such as a polyimide film, a polyester film, a polyethylene terephthalate film, a polyethylene naphthalate film, and a polycarbonate film, a glass fiber, a resin substrate reinforced with a plastic nonwoven fiber, a silicon substrate, and a glass substrate.

As shown in FIGS. 1A and 1B, the 180 degree peeling adhesive strength of the adhesive sheet 101 (104) against a silicon wafer is 5 (N/25 mm width) or less. Thereby, the adhesive sheet 101 (104) can be peeled off from a semiconductor element or the like without damaging the semiconductor element or a semiconductor chip made into an individual piece.

Materials constituting the adhesive layer 101 (103) are not especially limited, and examples include a material consisting of a thermosetting resin alone and a material consisting of a thermosetting resin and a thermoplastic resin.

Examples of the thermosetting resin include a phenol resin, an amino resin, an unsaturated polyester resin, an epoxy resin, a polyurethane resin, a silicone resin, and a thermosetting polyimide resin. These thermosetting resins can be used alone or two or more kinds can be used in combination. From the point of view that ionic impurities are few, an epoxy resin is preferable. In the case of using an epoxy resin, a phenol resin is preferably used as a curing agent.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonylphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate. In the present invention, an adhesive sheet comprising the epoxy resin, the phenol resin, and an acrylic resin is particularly preferable. Since these resins contain ionic impurities in only a small amount and have high heat resistance, the reliability of the semiconductor element can be ensured. About the blend ratio in this case, the amount of the mixture of the epoxy resin and the phenol resin is from 10 to 200 parts by weight for 100 parts by weight of the acrylic resin component.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

Among the thermoplastic resins, an acrylic resin is preferable in the respect that ionic impurities are few, heat resistance is high, and reliability of the semiconductor element can be secured. Such acrylic-based resins are not especially limited, and examples include polymers having components of one kind or two or more kinds of esters of acrylic acid and methacrylic acid having a straight chain or a branched alkyl group having 30 or fewer carbon atoms, especially 4 to 18 carbon atoms, such as a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a dodecyl group.

A different monomer which constitutes the above-mentioned polymer is not limited to any especial kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)methylacrylate; monomers which contain a sulfonic acid group, such as styrenesulfonic acid, allylsulfonic acid, 2-(meth)acryl amide-2-methylpropanesulfonic acid, (meth)acrylamidepropane sulfonic acid, sulfopropyl(meth)acrylate, and (meth) acryloyloxynaphthalenesulfonic acid; and monomers which contain a phosphoric acid group, such as 2-hydroxyethylacryloyl phosphate.

The adhesive sheet 101 (104) of the present invention improves the adhesive characteristic and attempts improvement of heat resistance under high temperature by performing a cross-linking process in the end. The cross-linking process is to lengthen the molecular chain length of the polymer and to properly make a cross-linking structure in the molecular chain by reactivity of the functional group introduced at the terminal of the molecular chain of the polymer. In order to achieve this objective, it is better to include a multi-functional compound that reacts with a functional group or the like at the terminal of the molecular chain of the polymer as a cross-linking agent in advance at the time of preparation of the adhesive sheet 101 (104).

The crosslinking agent may be one known in the prior art. Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 part by weight, the cohesive force is unfavorably insufficient. A different polyfunctional compound, such as an epoxy resin, together with the polyisocyanate compound may be incorporated if necessary. An inorganic filler may be appropriately incorporated into the adhesive sheet 101 (103) of the present invention in accordance with the use purpose thereof. The incorporation of the inorganic filler makes it possible to confer electric conductance to the sheet, improve the thermal conductivity thereof, and adjust the elasticity.

Examples of the inorganic fillers include various inorganic powders made of the following: a ceramic such as silica, clay, plaster, calcium carbonate, barium sulfate, aluminum oxide, beryllium oxide, silicon carbide or silicon nitride; a metal such as aluminum, copper, silver, gold, nickel, chromium, lead, tin, zinc, palladium or solder, or an alloy thereof; and carbon. These may be used alone or in combination of two or more thereof. Among these, silica, in particular fused silica is preferably used.

The average particle size of the inorganic filler is preferably from 0.1 to 80 μm. The addition amount of the inorganic filler is preferably set at 0 to 80 wt % relative to 100 parts by weight of the organic resin component. Especially preferably, it is 0 to 70 wt %.

If necessary, other additives besides the inorganic filler may be incorporated into the adhesive sheet 101 of the present invention. Examples thereof include a flame retardant, a silane coupling agent, and an ion trapping agent.

Examples of the flame retardant include antimony trioxide, antimony pentaoxide, and brominated epoxy resin. These may be used alone or in combination of two or more thereof.

Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These may be used alone or in combination of two or more thereof.

(Manufacturing Method of Semiconductor Device, and Semiconductor Device)

Figure 2:
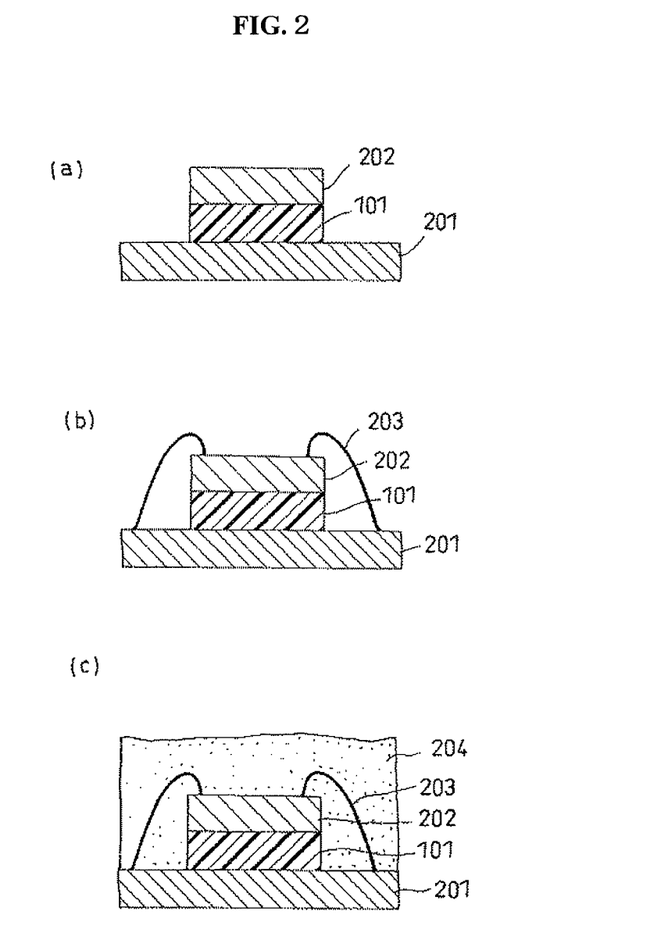
FIGS. 2A to 2C are process charts to manufacture a semiconductor device in an embodiment of the present invention.

The manufacturing method of semiconductor device according to the present invention is explained referring to FIGS. 2A and 2C. FIGS. 2A to 2C are process charts to manufacture a semiconductor device in an embodiment of the present invention.

The manufacturing method of a semiconductor device in the present embodiment performs, as shown in FIGS. 2A to 2C, a step of fixing a semiconductor element 202 on a circuit board (an adherend) 201 using a peelable adhesive sheet 101 for manufacturing a semiconductor device, a step of performing a wire bonding to the semiconductor element 202, and a step of sealing the semiconductor element 202 with a resin. Furthermore, in the case that trouble occurs in the step of fixing, the semiconductor element 202 is peeled off from the adhesive sheet 101 and the above-described step of fixing is repeated using another adhesive sheet.

The step of fixing the semiconductor element 202 onto the circuit board 201 is a step of pasting the semiconductor element 202 to the circuit board 201 interposing the adhesive sheet 101 therebetween (FIG. 2A). The method of fixing is not especially limited, and examples include a method by a roller and a method by vacuum pasting. Further, the order of pasting is also not especially limited, and for example, after layering the adhesive sheet 101 onto the circuit board 201, the semiconductor element 202 can be fixed on the adhesive sheet 101 so that a wire bond surface becomes the top. Further, the semiconductor element 202 to which the adhesive sheet 101 is fixed in advance may be fixed to the circuit board 201.

[Pasting of the adhesive sheet 101 to the circuit board 201 and the semiconductor element 202 is preferably performed at a temperature of 70° C. or less, and more preferably performed in the range of 25° C. to 70° C. Thereby, excessive adhesion of the adhesive sheet 101 to the circuit board 201 or the like can be suppressed, and the semiconductor element 202 can be prevented from being damaged when the adhesive sheet 101 is peeled off from the circuit board 201 or the like. Moreover, the semiconductor element 202 includes a semiconductor chip made into a chip (made into an individual piece).

The circuit board 201 is not especially limited, and specific examples include a metal lead frame such as a Cu lead frame and a 42 Alloy lead frame and an organic substrate comprising glass epoxy, BT (bismaleimide-triazin), polyimide, or the like. The substrate is not limited to these substrates, and may be a circuit substrate that can be used in the state that a semiconductor element is mounted on the substrate itself and is electrically connected thereto.

In the present step, in the case of pasting the adhesive sheet 101 to the semiconductor element 202 in the state that wrinkles are present in the adhesive sheet 101, and in the case that air bubbles are formed or foreign objects are mixed between the adhesive sheet 101 and the semiconductor element 202 or the circuit board 201, a step of peeling off the adhesive sheet 101 is performed. Thereby, the disposal of the semiconductor element 202 with the adhesive sheet 101 becomes unnecessary, and the semiconductor element 202 can be reused as a manufacturing part. As a result, suppression of the production cost can be attempted. Moreover, because the 180 degree peeling adhesive strength of the adhesive sheet 101 against a silicon wafer is 5 (N/25 mm width) or less, the peeling-off can be performed without damaging the semiconductor element 202. The peeling temperature at the time of peeling-off is preferably set lower than the pasting temperature in the pasting of the adhesive sheet 101 and the semiconductor element 202 or the like. This is to prevent the peeling-off of the adhesive sheet 101 from becoming difficult. Specifically, it is preferably in the range of 10° C. to 30° C. and more preferably in the range of 15° C. to 25° C.

The wire bonding step is a step of electrically connecting the tips of terminal portions (inner leads) of the circuit substrate 201 or the like to electrode pads (not illustrated) on the semiconductor element 202 through bonding wires 203 (see FIG. 2(b)). The bonding wires 203 may be, for example, gold lines, aluminum lines, or copper lines. The temperature when the wire bonding is performed is from 80 to 250° C., preferably from 80 to 220° C. The time for the heating is from several seconds to several minutes. The bonding is performed by use of both of vibration energy based on ultrasonic waves and pressing energy based on applied pressure in the state that the semiconductor element 202 and the circuit substrate 201 or the like are heated into the above-mentioned temperature range.

The step of sealing the semiconductor element 202 with a resin is a step of sealing the wire-bonded semiconductor element 202 with a sealing resin 204 (refer to FIG. 2C). The present step is performed to protect the semiconductor element 202 and a bonding wire 203 loaded in the circuit board 201. The present step is performed by molding the sealing resin 204 with a mold, for example. For example, an epoxy-based resin can be used as the sealing resin 204. The sealing with a resin is performed at a heating temperature of normally 175° C. for 60 to 90 minutes. However, the present invention is not limited to this, and it can be performed at 150 to 200° C. for a few minutes, for example. Thereby, the sealing resin 204 is cured and a semiconductor package can be obtained. After that, dicing of the semiconductor package is performed depending on necessity, and the semiconductor device according to the present invention can be produced.

(Other Items)

In the explanation above, the most preferred embodiment of the present invention is explained. However, the present invention is not limited to the embodiment and various changes are possible in practically the same range with the technical idea described in the claims of the present invention.

For example, the adhesive sheet of the present invention is not limited to the modes shown in the above-described embodiments, and an adhesive sheet unified with a dicing sheet can also be used, for example.

Figure 3:
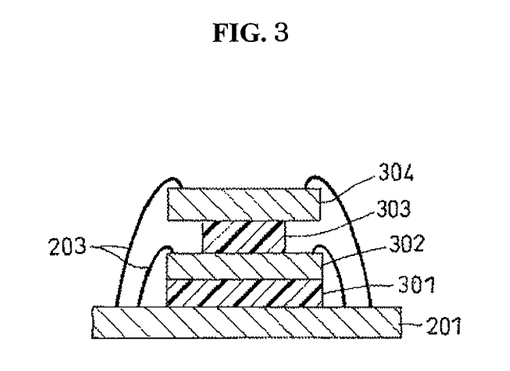
FIG. 3 is a sectional schematic view of the semiconductor device in another embodiment of the present invention, showing a state in which a plurality of semiconductor elements are three-dimensionally loaded on an adherend.

Further, the present invention is also applicable in the case that a plurality of semiconductor elements are three-dimensionally loaded by layering one by one on an adherend. FIG. 3 is a sectional schematic view showing a state in which a plurality of semiconductor elements are three-dimensionally loaded on an adherend. As shown in the figure, a first semiconductor element 302 is layered on a circuit board 201 interposing a first adhesive sheet 301 therebetween, and further, a second semiconductor element 304 is layered on a semiconductor element 302 interposing a second adhesive sheet 303 therebetween. Each electrode pad (not shown) of the first semiconductor element 302 and the second semiconductor element 304 is electrically connected to the terminal part in the circuit board 201 respectively with the bonding wire 203. A 180 degree peeling adhesive strength of the first adhesive sheet 301 and the second adhesive sheet 303 against a silicon wafer is 5 (N/25 mm width) or less. Therefore, in the case that wrinkles occur, air bubbles occur, or foreign objects are mixed in the first adhesive sheet 301 or the second adhesive sheet 303 at each loading stage of the first semiconductor element 302 and the second semiconductor element 304, the first adhesive sheet 301 or the second adhesive sheet 303 can be peeled off without damaging the first semiconductor element 302 and the second semiconductor element 304. Furthermore, because the peeled first semiconductor element 302 and the second semiconductor element 304 can be reused without being disposed of suppression of the production cost can be attempted even in the case of such a mode. Here, the first adhesive sheet 301 and the second adhesive sheet 303 may consist of a composition of a same kind, and may consist of a composition of a different kind. Further, the condition of fixing the circuit board 201 and the first semiconductor element 302, and the first semiconductor element 302 and the second semiconductor element 304, the condition of wire bonding, and the condition of sealing with a resin are the same as described above. Moreover, a silicon nitride layer or a buffer coating layer containing a heat resistant resin such as a polyimide resin may be provided on the layered face of the first semiconductor element 302 and the second semiconductor element 304 in the circuit board 201.

Preferred examples of this invention will be illustratively described in detail hereinafter. However, materials, blend amounts and others that will be described in the Examples do not limit to this invention unless any restrictive description is particularly included. Thus, these are mere explanatory examples. In the examples, the word "part(s)" represent "part(s) by weight", respectively, unless otherwise specified.

Example 1

Into methyl ethyl ketone were dissolved 100 parts of an acrylic ester type polymer made mainly of ethyl acrylate and methyl methacrylate (PARACRON W-197CM, manufactured by Negami Chemical Industrial Co., Ltd.), 3 parts of a polyfunctional isocyanate type crosslinking agent, 23 parts of an epoxy resin (Epikote 1004, manufactured by Japan Epoxy Resin Co., Ltd.), and 6 parts of a phenol resin (Milex XLC-CC, manufactured by Mitsui Chemicals, Inc. Chemicals, Inc.), so as to prepare an adhesive composition solution having a concentration of 20% by weight.

This adhesive composition solution was applied onto a release-treated film made of a polyethylene terephthalate film (thickness: 50 μm) treated for release with silicone as a releasing liner. The resultant was then dried at 120° C. for 3 minutes to form an adhesive sheet having a 25 μm of thickness according to Example 1.

Example 2

An adhesive sheet according to Example 2 was formed in the same way as in Example 1 except that a polymer made mainly of butyl acrylate (PARACRON SN-710, manufactured by Negami Chemical Industrial Co., Ltd.) was used instead of the acrylic ester type polymer used in Example 1. The adhesive layer had a 25 μm of thickness.

Comparative Example 1

A solution of an adhesive composition with a concentration of 20% by weight was prepared by dissolving 27 parts of an epoxy rein (EPPN-501NY, manufactured by Nippon Kayaku Co., Ltd.), 29 parts of a phenol resin (MILEX XLC-LL, manufactured by Mitsui Chemicals, Inc.), and 2 parts of a curing promoting agent (triphenylphosphine, manufactured by Hokko Chemical Industry, Co., Ltd.) relative to 30 parts of an acrylic ester-based polymer having ethyl acrylate-methyl methacrylate as a main component (PARACRON W-197CM, manufactured by Negami Chemical Industrial Co., Ltd.) into methylethylketone.

This adhesive composition solution was applied onto a release-treated film made of a polyethylene terephthalate film (thickness: 50 μm) treated for release with silicone as a releasing liner. The resultant was then dried at 120° C. for 3 minutes to form an adhesive sheet having a 25 μm of thickness according to Comparative Example 1. (Comparative Example 2)

An adhesive sheet according to Comparative Example 2 was formed in the same way as in Comparative Example 1 except that the polymer made mainly of butyl acrylate (PARACRON SN-710, manufactured by Negami Chemical Industrial Co., Ltd.) was used instead of the acrylic ester type polymer used in Comparative Example 1. The adhesive layer had a 25 μm of thickness.

[Measurement of Adhesive Strength]

About each of the adhesive sheets formed in the above-mentioned Examples and Comparative Examples, the shear adhesive force thereof to a silicone wafer was measured at the time of pre-sticking/fixing as follows:

First, a silicon wafer of 6 inches in diameter (thickness 0.6 mm) was prepared, and an adhesive sheet for protecting a semiconductor wafer was pasted onto the wafer. DR-8500II manufactured by Nitto Seiki Co., Ltd. was used for pasting. Furthermore, the back surface of the silicon wafer was ground using a wafer grinding apparatus (DFG-840, manufactured by Disco Corporation). Thereby, a silicon wafer of 150 μm in thickness was obtained.

Next, each adhesive sheet according to the examples and comparative examples was pasted to a silicon wafer on a heat plate at 40° C. Successively, an adhesive tape for peeling (BT-315, manufactured by Nitto Denko Co., Ltd.) was pasted to the surface opposite to the surface where the adhesive sheet was pasted at room temperature using a 2 kg hand roller. After 30 minutes, the sheet was measured in 25 mm width following JIS Z0237. The peeling angle was 180 degrees and the peeling speed was 300 mm/min. The result is shown in table 1 below.

TABLE 1

|  | Example 1 | Example 2 | Comparative Example 1 | Comparative Example 2 |
| --- | --- | --- | --- | --- |
| Content of Acrylic Resin (Part by Weight) | 100 | 100 | 30 | 30 |
| Thickness of Adhesive Layer (μm) | 25 | 25 | 25 | 25 |
| Pasting Temperature (° C.) | 40 | 40 | 40 | 40 |

TABLE 1-continued

| | Example 1 | Example 2 | Comparative Example 1 | Comparative Example 2 |
|---|---|---|---|---|
| Adhesive Strength with Silicon Wafer (N/25 mm width) | 1.3 | 1.7 | Impossible to Peel Off | Impossible to Peel Off |
| Damage State of Silicon Wafer | No Damage | No Damage | — | — |

As is clear from table 1, the adhesive strength of the adhesive sheet in example 1 was 1.3 N/25 mm width, and the adhesive strength of the adhesive sheet in example 2 was 1.7 N/25 mm width. Further, at the time of peeling, there was no damage on each silicon wafer. On the other hand, the adhesive strength of the adhesive sheets in comparative examples 1 and 2 was strong and the sheets could not be peeled off.

What is claimed is:

1. A method of manufacturing a semiconductor device, comprising:
    fixing a semiconductor element to an adherend using an adhesive sheet for manufacturing a semiconductor device used when a semiconductor element is adhered to an adherend and the semiconductor element is wire-bonded, wherein a 180 degree peeling adhesive strength against a silicon wafer is 5 (N/25 mm width) or less, wherein said adhesive sheet for manufacturing a semiconductor element is removably attached to said semiconductor element such that removal of said adhesive sheet from said semiconductor element does not damage said semiconductor element;
    peeling the adhesive sheet from the semiconductor element without damaging the semiconductor element;
    bonding wires to the semiconductor element after peeling the adhesive sheet from the semiconductor element; and
    resin-sealing the semiconductor element with a sealing resin,
    wherein the adherend is a substrate, lead frame, or semiconductor element.

2. A method of manufacturing a semiconductor device of comprising:
    fixing a semiconductor element to an adherend using an adhesive sheet for manufacturing a semiconductor device used when a semiconductor element is adhered to an adherend and the semiconductor element is wire-bonded, wherein a 180 degree peeling adhesive strength against a silicon wafer is 5 (N/25 mm width) or less, wherein said adhesive sheet for manufacturing a semiconductor element is removably attached to said semiconductor element such that removal of said adhesive sheet from said semiconductor element does not damage said semiconductor element;
    peeling the adhesive sheet from the semiconductor element without damaging the semiconductor element to remove the adhesive sheet from the semiconductor element and repeating the fixing step using a second adhesive sheet having the same properties as the removed adhesive sheet;
    bonding wires to the semiconductor element after peeling the adhesive sheet from the semiconductor element; and
    resin-sealing the semiconductor element with a sealing resin,
    wherein the adherend is a substrate, lead frame, or semiconductor element.

* * * * *